United States Patent
Chien

(10) Patent No.: US 10,748,607 B2
(45) Date of Patent: Aug. 18, 2020

(54) NON-VOLATILE MEMORY DEVICE AND ASSOCIATED PERIPHERAL CIRCUIT WITH DATA VERIFYING AND REWRITING FUNCTIONS

(71) Applicant: eMemory Technology Inc., Hsin-Chu (TW)

(72) Inventor: Yu-Shan Chien, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 0 days.

(21) Appl. No.: 16/553,244

(22) Filed: Aug. 28, 2019

(65) Prior Publication Data

US 2020/0160924 A1   May 21, 2020

Related U.S. Application Data

(60) Provisional application No. 62/768,099, filed on Nov. 16, 2018.

(51) Int. Cl.

| G11C 11/56 | (2006.01) |
|---|---|
| G11C 5/14 | (2006.01) |
| G11C 16/30 | (2006.01) |
| G11C 16/24 | (2006.01) |
| G11C 16/28 | (2006.01) |
| G11C 16/08 | (2006.01) |
| G11C 16/04 | (2006.01) |
| G11C 16/10 | (2006.01) |
| G11C 16/26 | (2006.01) |

(Continued)

(52) U.S. Cl.
CPC ............ *G11C 11/5642* (2013.01); *G05F 3/22* (2013.01); *G05F 3/30* (2013.01); *G11C 5/147* (2013.01); *G11C 16/0408* (2013.01); *G11C 16/0433* (2013.01); *G11C 16/08* (2013.01); *G11C 16/10* (2013.01); *G11C 16/14* (2013.01); *G11C 16/24* (2013.01); *G11C 16/26* (2013.01); *G11C 16/28* (2013.01); *G11C 16/30* (2013.01); *G11C 16/3445* (2013.01); *G11C 16/3459* (2013.01); *H01L 27/0207* (2013.01); *H01L 27/11524* (2013.01)

(58) Field of Classification Search
CPC ............ G11C 11/5642; G11C 11/1677; G11C 13/0064; G11C 16/3481
See application file for complete search history.

(56) References Cited

U.S. PATENT DOCUMENTS

| 9,805,776 B2 | 10/2017 | Lin | |
| 2006/0209583 A1* | 9/2006 | Kawabata | G11C 15/00 365/49.1 |
| 2007/0211537 A1* | 9/2007 | Park | G11C 16/3454 365/185.22 |

* cited by examiner

*Primary Examiner* — Han Yang
(74) *Attorney, Agent, or Firm* — WPAT, PC

(57) ABSTRACT

A non-volatile memory device includes a memory cell array, a Y decoder, a program register, a sense amplifier, a verification circuit and a path control circuit. The memory cell array includes a first memory cell. The first memory cell is connected with a bit line. The Y decoder includes a first decoding element. The first decoding element is connected between the bit line and a data line. The program register is connected with the data line, and generates a control voltage to the first memory cell. The sense amplifier is connected with the data line, and generates a read data. The verification circuit is connected between the sense amplifier and the data line, and generates a rewrite data. The path control circuit is connected with the data line, and receives a write data and the rewrite data.

15 Claims, 7 Drawing Sheets

(51) Int. Cl.
*G11C 16/34* (2006.01)
*G05F 3/30* (2006.01)
*G05F 3/22* (2006.01)
*G11C 16/14* (2006.01)
*H01L 27/02* (2006.01)
*H01L 27/11524* (2017.01)

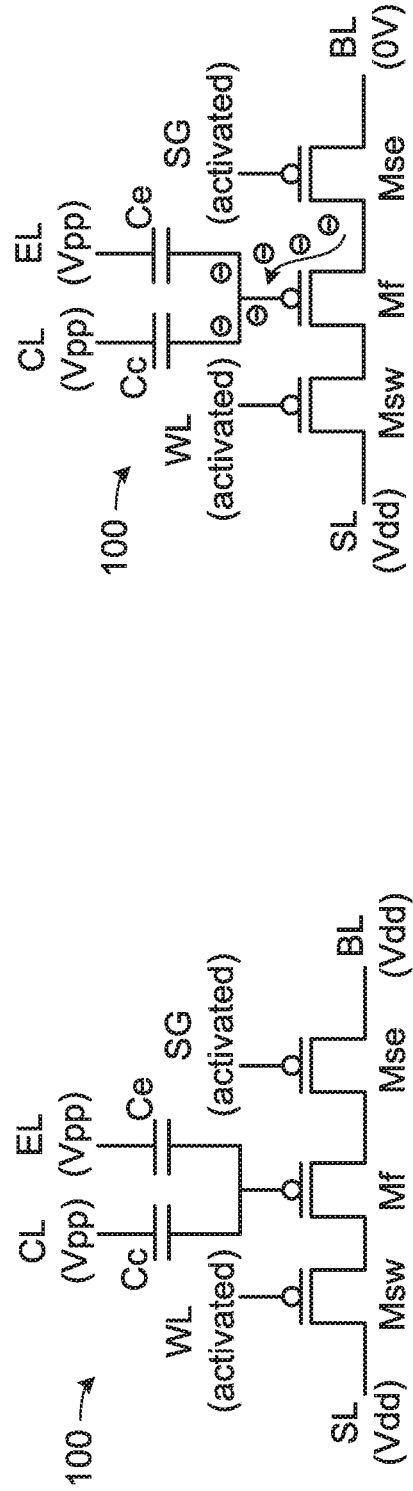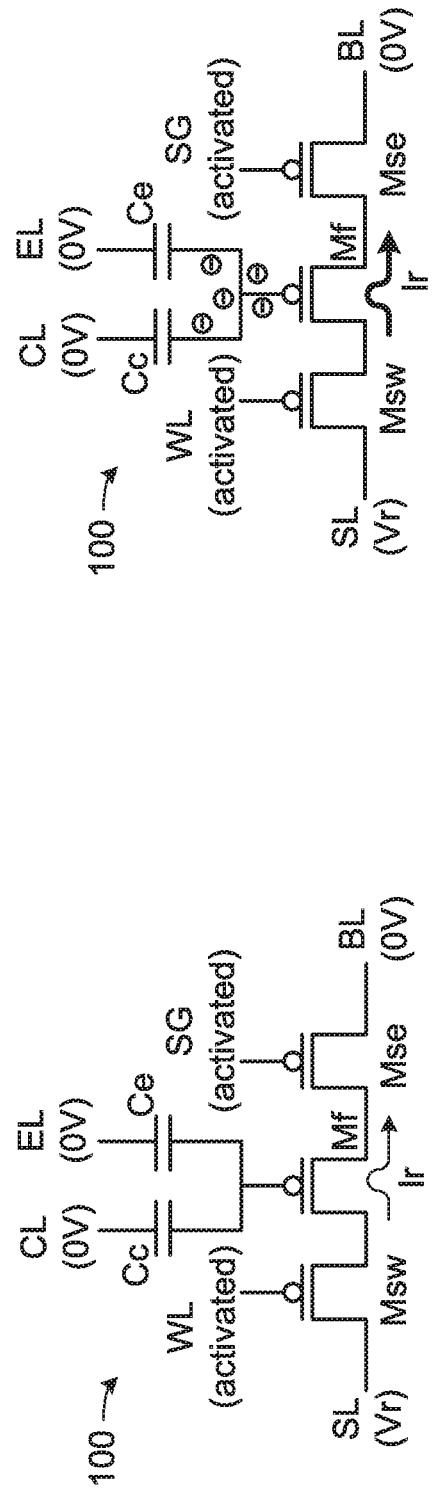

NON-VOLATILE MEMORY DEVICE AND ASSOCIATED PERIPHERAL CIRCUIT WITH DATA VERIFYING AND REWRITING FUNCTIONS

This application claims the benefit of U.S. provisional application Ser. No. 62/768,099, filed Nov. 16, 2018, the subject matter of which is incorporated herein by reference.

FIELD OF THE INVENTION

The present invention relates to a non-volatile memory device and a peripheral circuit, and more particularly to a non-volatile memory device and a peripheral circuit with the data verifying and rewriting functions.

BACKGROUND OF THE INVENTION

As known, a non-volatile memory device can retain the stored data for a long time. Even if the electronic device with the non-volatile memory device is powered off, the stored data are not lost. For assuring the accuracy of the write data in the non-volatile memory device, it is necessary to perform a verification operation on the write data after the program operation on the non-volatile memory device is completed. If the result of the verification operation fails, it is necessary to perform the program operation on the non-volatile memory device again until the result of the verification operation on the write data passes.

Moreover, U.S. Pat. No. 9,805,776 discloses a memory device, a peripheral circuit and a single-byte data write method thereof.

The present invention provides a non-volatile memory device with a novel structure and a peripheral device thereof.

SUMMARY OF THE INVENTION

An embodiment of the present invention provides a non-volatile memory device. The non-volatile memory device includes a memory cell array, a Y decoder, a program register, a sense amplifier, a verification circuit and a path control circuit. The memory cell array includes a first memory cell. The first memory cell is connected with a bit line. The Y decoder includes a first decoding element. The first decoding element is connected between the bit line and a data line. The program register is connected with the data line, and generates a control voltage to the first memory cell. The sense amplifier is connected with the data line, and generates a read data. The verification circuit is connected between the sense amplifier and the data line, and generates a rewrite data. The path control circuit is connected with the data line, and receives a write data and the rewrite data.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIGS. 1A to 1E are schematic circuit diagrams illustrating various operations of a non-volatile memory cell according to an embodiment of the present invention;

DETAILED DESCRIPTION OF PREFERRED EMBODIMENTS

Figure 1E:
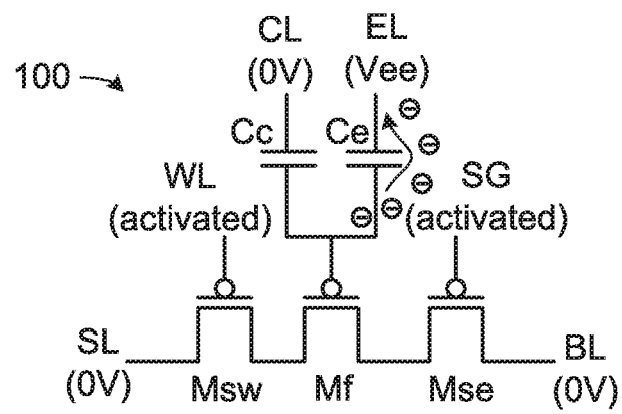

Generally, a non-volatile memory cell comprises a floating gate transistor with a floating gate. During a program cycle, the storage state of the non-volatile memory cell is determined according to the amount of electrons injected into the floating gate. For example, if no electrons are injected into the floating gate, the non-volatile memory cell is in a first storage state. Whereas, if the electrons are injected into the floating gate, the non-volatile memory cell is in a second storage state.

While a read operation is performed, a read current is generated according to the amount of electrons in the floating gate. According to the magnitude of the read current, a sense amplifier determines the storage state of the non-volatile memory cell. For example, the sense amplifier receives the read current. If the magnitude of the read current is very low, the non-volatile memory cell is judged to be in a first storage state. Whereas, if the magnitude of the read current is very high, the non-volatile memory cell is judged to be in a second storage state. For illustration, two types of non-volatile memory cells will be taken as examples. However, the types of the non-volatile memory cells are not restricted.

FIGS. 1A to 1E are schematic circuit diagrams illustrating various operations of a non-volatile memory cell according to an embodiment of the present invention.

As shown in FIG. 1A, the non-volatile memory cell 100 comprises a switch transistor Msw, a floating gate transistor Mf, a select transistor Mse, a capacitor Ce and a capacitor Cc. The switch transistor Msw, the floating gate transistor Mf and the select transistor Mse are p-type transistors.

The switch transistor Msw, the floating gate transistor Mf and the select transistor Mse are serially connected between a source line SL and a bit line BL. The control terminal of the switch transistor Msw is connected with a word line WL. The control terminal of the select transistor Mse is connected with a select gate line SG. A first terminal of the capacitor Ce and a first terminal of the capacitor Cc are connected with a floating gate of the floating gate transistor Mf. A second terminal of the capacitor Ce is connected with an erase line EL. A second terminal of the capacitor Cc is connected with a control line CL. A program path and a read path are formed between the source line SL and the bit line BL. An erase path is formed between the floating gate and the erase line EL.

Please refer to FIGS. 1A and 1B. During a program cycle, the word line WL and the select gate line SG are activated. For example, the word line WL and the select gate line SG receive 0V. Consequently, the non-volatile memory cell 100 is a selected memory cell.

Please refer to FIG. 1A. For programming the non-volatile memory cell 100 to a first storage state, a first power supply voltage Vdd is provided to the source line SL and the bit line BL, and a program voltage Vpp is provided to the control line CL and the erase line EL. The magnitude of the program voltage Vpp is higher than the magnitude of the first power supply voltage Vdd. For example, the program voltage Vpp is 10V, and the first power supply voltage Vdd is 5V.

Since both of the source line SL and the bit line BL receive the first power supply voltage Vdd, the program path between the source line SL and the bit line BL does not generate a program current. Consequently, no electrons are injected into the floating gate of the floating gate transistor Mf. Meanwhile, the non-volatile memory cell 100 is programmed to the first storage state.

Please refer to FIG. 1B. For programming the non-volatile memory cell 100 to a second storage state, the first power supply voltage Vdd is provided to the source line SL, a ground voltage (0V) is provided to the bit line BL, and the program voltage Vpp is provided to the control line CL and the erase line EL. Since the program path between the source line SL and the bit line BL generates the program current, electrons are injected into the floating gate of the floating gate transistor Mf. Meanwhile, the non-volatile memory cell 100 is programmed to the second storage state.

According to the difference of the bias voltages as shown in FIGS. 1A and 1B, the following conclusions are obtained. When the bit line BL receives the first power supply voltage Vdd, the non-volatile memory cell 100 is programmed to the first storage state. When the bit line BL receives the ground voltage (0V), the non-volatile memory cell 100 is programmed to the second storage state.

Please refer to FIGS. 1C and 1D. While a read operation is performed, the word line WL and the select gate line SG are activated. Consequently, the non-volatile memory cell 100 is the selected memory cell. Moreover, a read voltage Vr is provided to the source line SL, and the ground voltage (0V) is provided to the bit line BL, the control line CL and the erase line EL. The magnitude of the read voltage Vr is lower than the magnitude of the first power supply voltage Vdd. For example, the read voltage Vr is 3.3V.

As shown in FIG. 10, the non-volatile memory cell 100 is in the first storage state. Since no electrons are stored in the floating gate of the floating gate transistor Mf, the magnitude of the read current Ir generated by the read path between the source line SL and the bit line BL is very low (e.g., nearly zero).

As shown in FIG. 1D, the non-volatile memory cell 100 is in the second storage state. Since electrons are stored in the floating gate of the floating gate transistor Mf, the magnitude of the read current Ir generated by the read path between the source line SL and the bit line BL is higher.

Please refer to FIGS. 1C and 1D. While the read operation is performed, the non-volatile memory cell 100 is judged to be in the first storage state or the second storage state according to the magnitude of the read current flowing through the bit line BL.

For example, the sense amplifier is connected with the bit line BL to receive the read current Ir. Moreover, the sense amplifier further receives a reference current Iref. If the magnitude of the read current Ir is lower than the reference current Iref, the sense amplifier judges that the non-volatile memory cell 100 is in the first storage state. Whereas, if the magnitude of the read current Ir is higher than the reference current Iref, the sense amplifier judges that the non-volatile memory cell 100 is in the second storage state. Generally, the examples of the sense amplifier for performing the above operations are not restricted.

Please refer to FIG. 1E. While an erase operation is performed, the word line WL and the select gate line SG are activated. Consequently, the non-volatile memory cell 100 is the selected memory cell. Moreover, the ground voltage (0V) is provided to the source line SL, the bit line BL and the control line CL, and an erase voltage Vee is provided to the erase line EL. Meanwhile, the electrons are ejected from the floating gate and transmitted to the erase line EL through the capacitor C2. The magnitude of the erase voltage Vee is higher than the magnitude of the first power supply voltage Vdd. For example, the erase voltage Vee is 12V.

Figure 2:
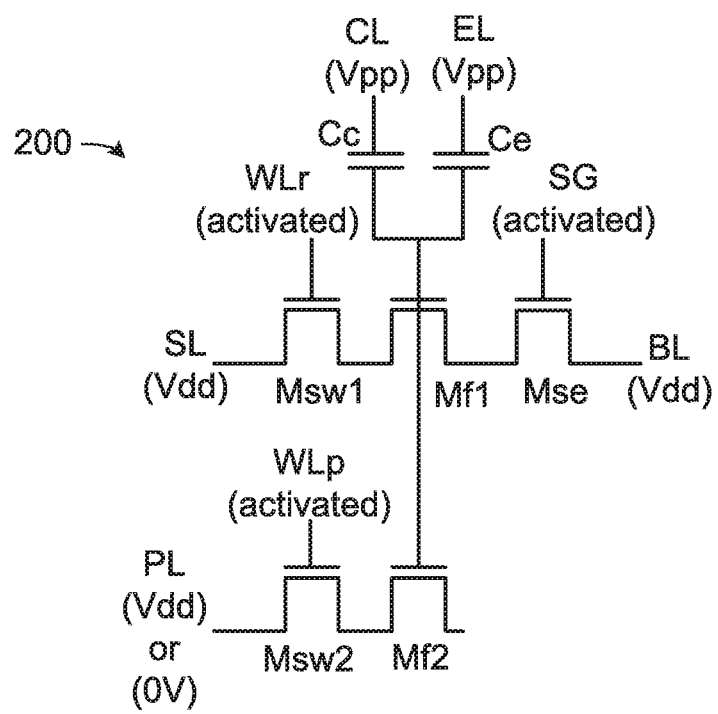
FIG. 2 is a schematic circuit diagram illustrating a non-volatile memory cell according to another embodiment of the present invention.

In the above embodiment, the transistors of the non-volatile memory cell are p-type transistors. In some other embodiments, the transistors of the non-volatile memory cell are n-type transistors. FIG. 2 is a schematic circuit diagram illustrating a non-volatile memory cell according to another embodiment of the present invention. As shown in FIG. 2, the non-volatile memory cell 200 comprises two switch transistors Msw1 and Msw2, two floating gate transistors Mf1 and Mf2, a select transistor Mse, a capacitor Ce and a capacitor Cc. These transistors are n-type transistors.

In comparison with the non-volatile memory cell 100, the program path of the non-volatile memory cell 200 is distinguished. In this embodiment, a read path is formed between the source line SL and the bit line BL, a program path is formed between a program line PL and the floating gate, and an erase path is formed between the floating gate and the erase line EL.

During a program cycle, the word lines WLr and WLp and the select gate line SG are activated. For example, the word lines WLr and WLp and the select gate line SG receive a first power supply voltage Vdd. Consequently, the non-volatile memory cell 200 is a selected memory cell. Moreover, the first power supply voltage Vdd is provided to the source line SL and the bit line BL, and the program voltage Vpp is provided to the control line CL and the erase line EL.

When the first power supply voltage Vdd is provided to the program line PL, no electrons are injected into the floating gates. Consequently, the non-volatile memory cell 200 is programmed to a first storage state. When the ground voltage (0V) is provided to the program line PL, electrons are injected into the floating gates. Consequently, the non-volatile memory cell 200 is programmed to a second storage state.

While a read operation is performed, the bit line BL generates a read current through the read path of the non-volatile memory cell 200.

While an erase operation is performed, the electrons are ejected from the floating gates through the erase path of the non-volatile memory cell 200. The bias voltages are not redundantly described herein.

As mentioned above, the first power supply voltage Vdd or the ground voltage (0V) is provided to a specified line of the non-volatile memory cell 200 during the program cycle. Consequently, the non-volatile memory cell 200 is programmed to the first storage state or a second storage state.

Figure 3:
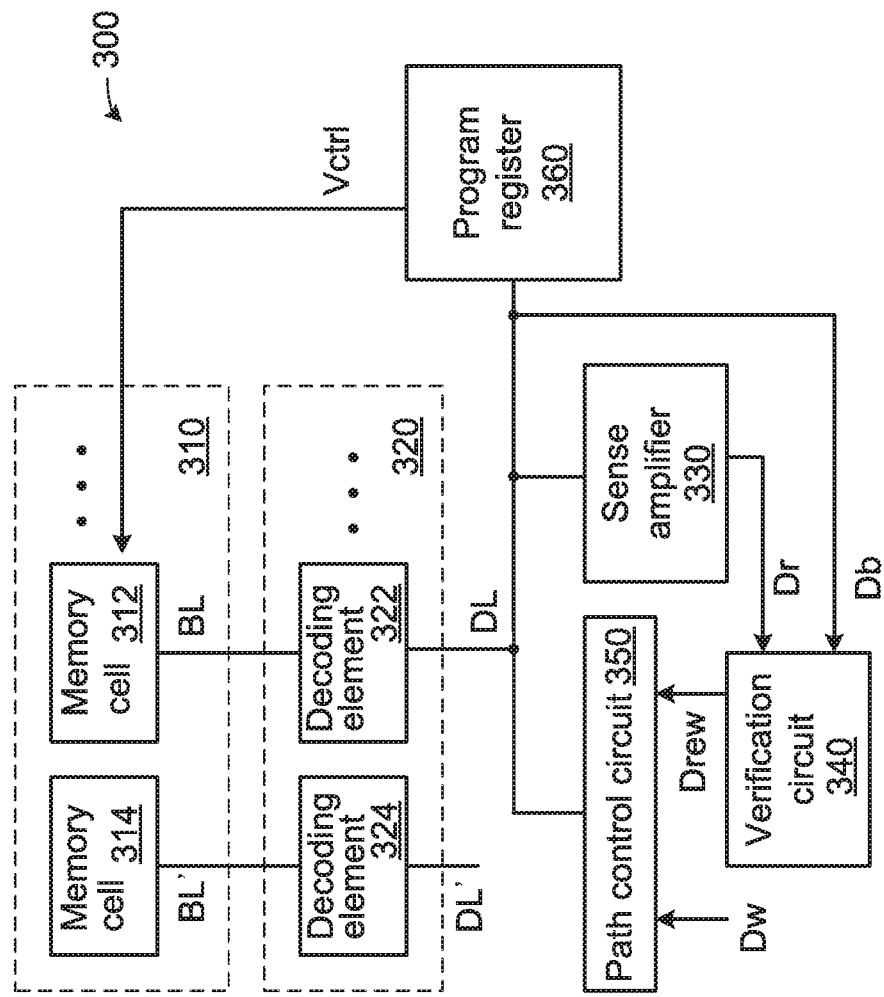
FIG. 3 is a schematic circuit diagram illustrating a non-volatile memory device according to an embodiment of the present invention.

FIG. 3 is a schematic circuit diagram illustrating a non-volatile memory device according to an embodiment of the present invention. As shown in FIG. 3, the non-volatile memory device 300 comprises a memory cell array 310, a Y decoder 320, a sense amplifier 330, a verification circuit 340, a path control circuit 350 and a program register 360. The Y decoder 320, the sense amplifier 330, the verification circuit 340, the path control circuit 350 and the program register 360 may considered as peripheral circuits.

The memory cell array 310 comprises plural memory cells 312 and 314. Preferably but not exclusively, the structure of each of the memory cells 312 and 314 is identical to the structure of the non-volatile memory cell 100 as shown in FIG. 1A or the structure of the non-volatile memory 200 as shown in FIG. 2. The memory cell 312 comprises a bit line BL. The memory cell 314 comprises a bit line BL'.

The Y decoder 320 comprises decoding elements 322 and 324. The decoding element 322 is connected with the bit line BL and a data line DL. The decoding element 324 is connected with the bit line BL' and a data line DL'. While the read operation is performed, one of the decoding elements 322 and 324 of the Y decoder 320 is activated, but the other decoding elements are inactivated. For example, in case that the decoding element 322 is activated during the read operation, the bit line BL is connected with the data line DL through the decoding element 322.

The sense amplifier 330 is connected with the data line DL and the verification circuit 340. The sense amplifier 330 may generate a read data Dr to the verification circuit 340.

The program register 360 is connected with the data line DL. During the program cycle, the program register 360 generates a control voltage Vctrl to the memory cell array 310 according to the signal of the data line DL.

The verification circuit 340 is connected with the sense amplifier 330 and the data line DL. While a verification operation is performed, the verification circuit 340 receives the read data Dr from the sense amplifier 330 and a return data Db from the program register 360 and generates a rewrite data Drew.

The path control circuit 350 is connected with the data line DL and the verification circuit 340. While the write operation, the read operation, the verification operation or the rewrite operation is performed, the path control circuit 350 transmits the write data Dw to the data line DL or transmits the rewrite data Drew to the data line DL.

In the non-volatile memory device 300, the data line DL' is also connected with the sense amplifier, the verification circuit, the path control circuit and the program register 360.

FIGS. 4A to 4D are schematic circuit block diagrams illustrating the signal transmission path of the non-volatile memory device during a program cycle of the non-volatile memory device according to the embodiment of the present invention. In the following examples, the memory cell 312 is the selected memory cell. In addition, the signal transmission paths of the non-volatile memory device 300 corresponding to a write operation, a read operation, a verification operation and a rewrite operation will be described.

Figure 4A:
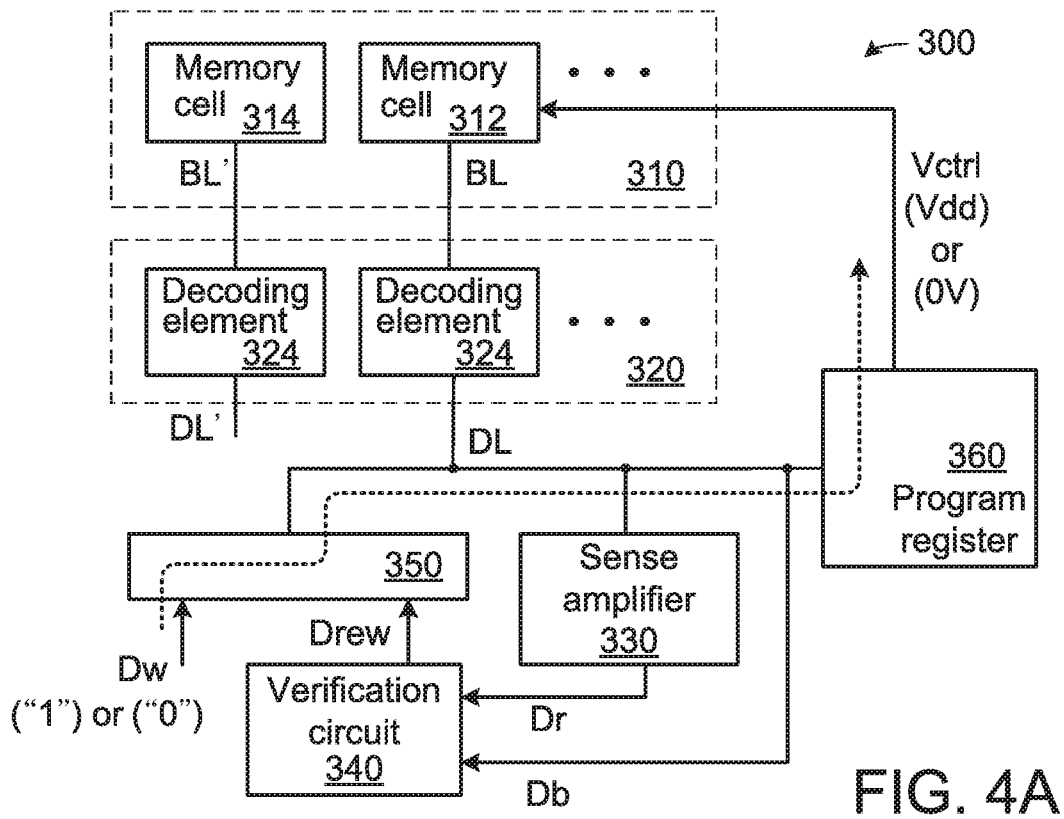
FIGS. 4A to 4D are schematic circuit block diagrams illustrating the signal transmission path of the non-volatile memory device during a program cycle of the non-volatile memory device according to the embodiment of the present invention.

Please refer to FIG. 4A. While the write operation is performed, the write data Dw from the external portion of the non-volatile memory device 300 is transmitted to the data line DL through the path control circuit 350.

After the write data Dw from the data line DL is received by the program register 360, the write data Dw is temporarily stored in the program register 360. Then, the write data Dw is converted into a control voltage Vctrl by the program register 360, and the control voltage Vctrl is transmitted to the selected memory cell 312 of the memory cell array 310. According to the control voltage Vctrl, the selected memory cell 312 is programmed to the first storage state or the second storage state. Moreover, while the write operation is performed, the sense amplifier 330 and the verification circuit 340 are disabled.

For example, when the write data Dw is "1", the write data Dw is stored in the program register 360, and the control voltage Vctrl with a first voltage Vdd is generated by the program register 360. Consequently, the selected memory cell 312 is programmed to the first storage state. When the write data Dw is "0", the write data Dw is stored in the program register 360, and the control voltage Vctrl with the ground voltage (0V) is generated by the program register 360. Consequently, the selected memory cell 312 is programmed to the second storage state.

Figure 4B:
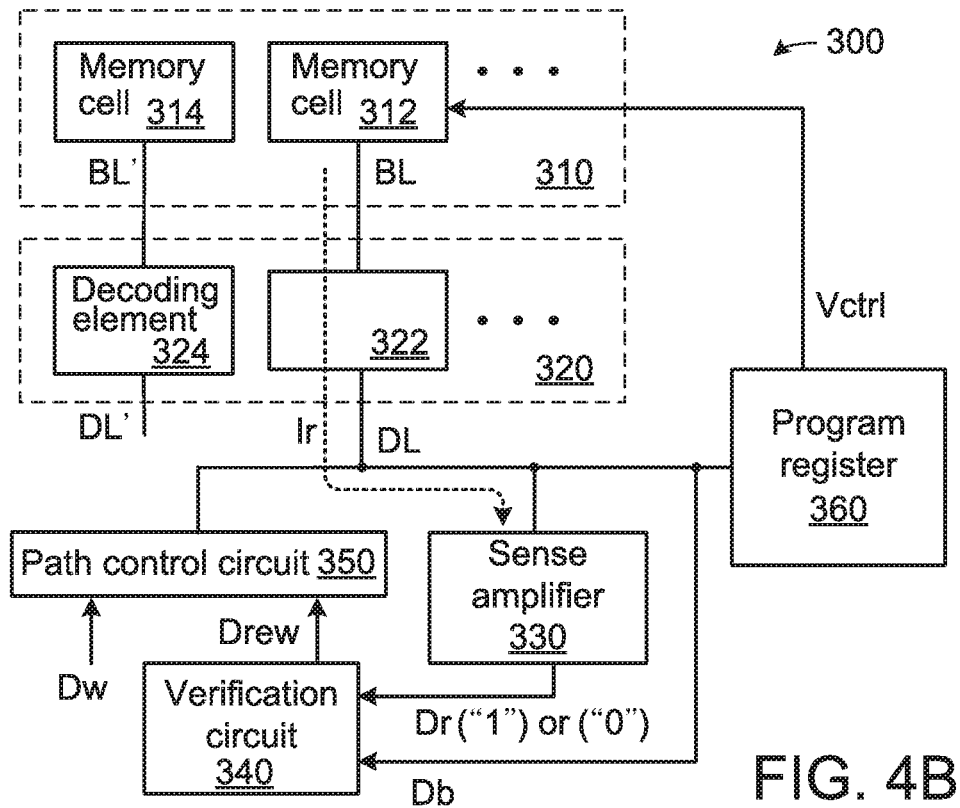

Please refer to FIG. 4B. While the read operation is performed, the bit line BL is connected with the data line DL through the decoding element 322. Consequently, the selected memory cell 312 generates a read current Ir to the sense amplifier 330. According to the magnitude of the read current Ir, the storage state of the selected memory cell 312 is determined by the sense amplifier 330. While the read operation is performed, the path control circuit 350, the program register 360 and the verification circuit 340 are inactivated.

For example, if the magnitude of the read current Ir generated by the selected memory cell 312 is lower than the reference current, the selected memory cell 312 is judged to be in the first storage state. Meanwhile, the read data Dr generated by the sense amplifier 330 is "0". Whereas, if the magnitude of the read current Ir generated by the selected memory cell 312 is higher than the reference current, the selected memory cell 312 is judged to be in the second storage state. Meanwhile, the read data Dr generated by the sense amplifier 330 is "1".

Figure 4C:
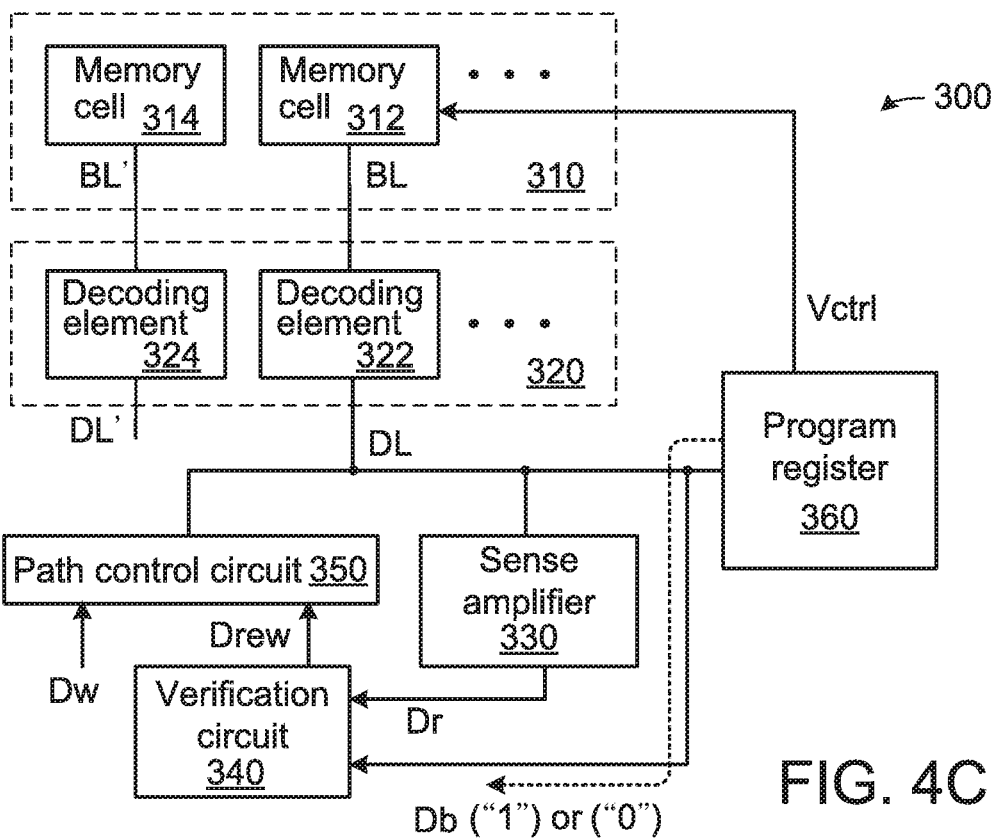

Please refer to FIG. 4C. While the verification operation is performed, the program register 360 issues the return data Db to the data line DL and the verification circuit 340. Since the return data Db is the write data Dw that is temporarily stored in the program register 360 while the write operation is performed. According to the return data Db and the read data Dr, the verification circuit 340 judges the accuracy of the storage state of the selected memory cell 312.

If the verification circuit 340 confirms that the storage state of the selected memory cell 312 is accurate, the verification operation passes and the program cycle is completed. Whereas, if the verification circuit 340 confirms that the storage state of the selected memory cell 312 is erroneous, the verification circuit 340 generates the rewrite data Drew.

Figure 4D:
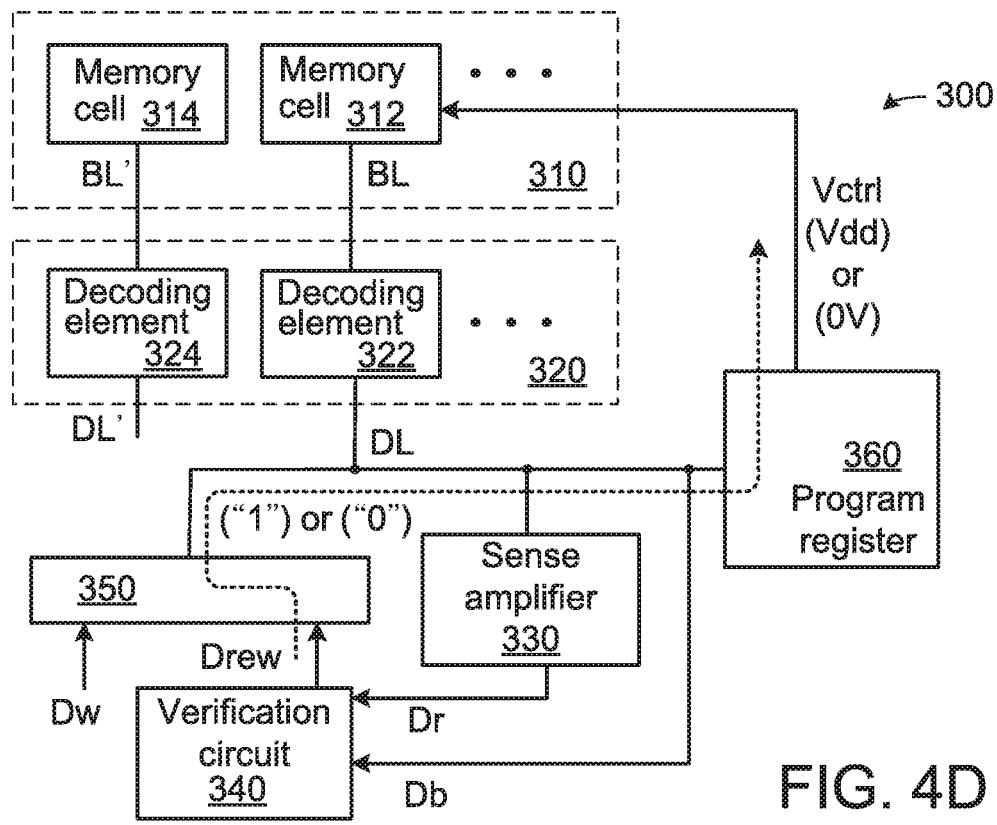

Please refer to FIG. 4D. While the rewrite operation is performed, the rewrite data Drew is transmitted from the path control circuit 350 to the data line DL. After the rewrite data Drew from the data line DL is received by the program register 360, the rewrite data Drew is temporarily stored in the program register 360. Then, the rewrite data Drew is converted into a control voltage Vctrl by the program register 360, and the control voltage Vctrl is transmitted to the selected memory cell 312 of the memory cell array 310. According to the control voltage Vctrl, the selected memory cell 312 is programmed to the first storage state or the second storage state.

From the above descriptions, the non-volatile memory device 300 of the present invention provides a peripheral circuit. During the program cycle, the peripheral circuit performs the write operation, the read operation, verification operation and the rewrite operation on the selected memory cell. The above operations are repeatedly done until the verification operation passes and the program cycle is completed. After the program cycle is completed, the write data Dw is accurately written into the selected memory cell.

The circuitry structures of the decoding element 322, the program register 360, the verification circuit 340 and the path control circuit 350 will be described in more details as follows.

Figure 5A:
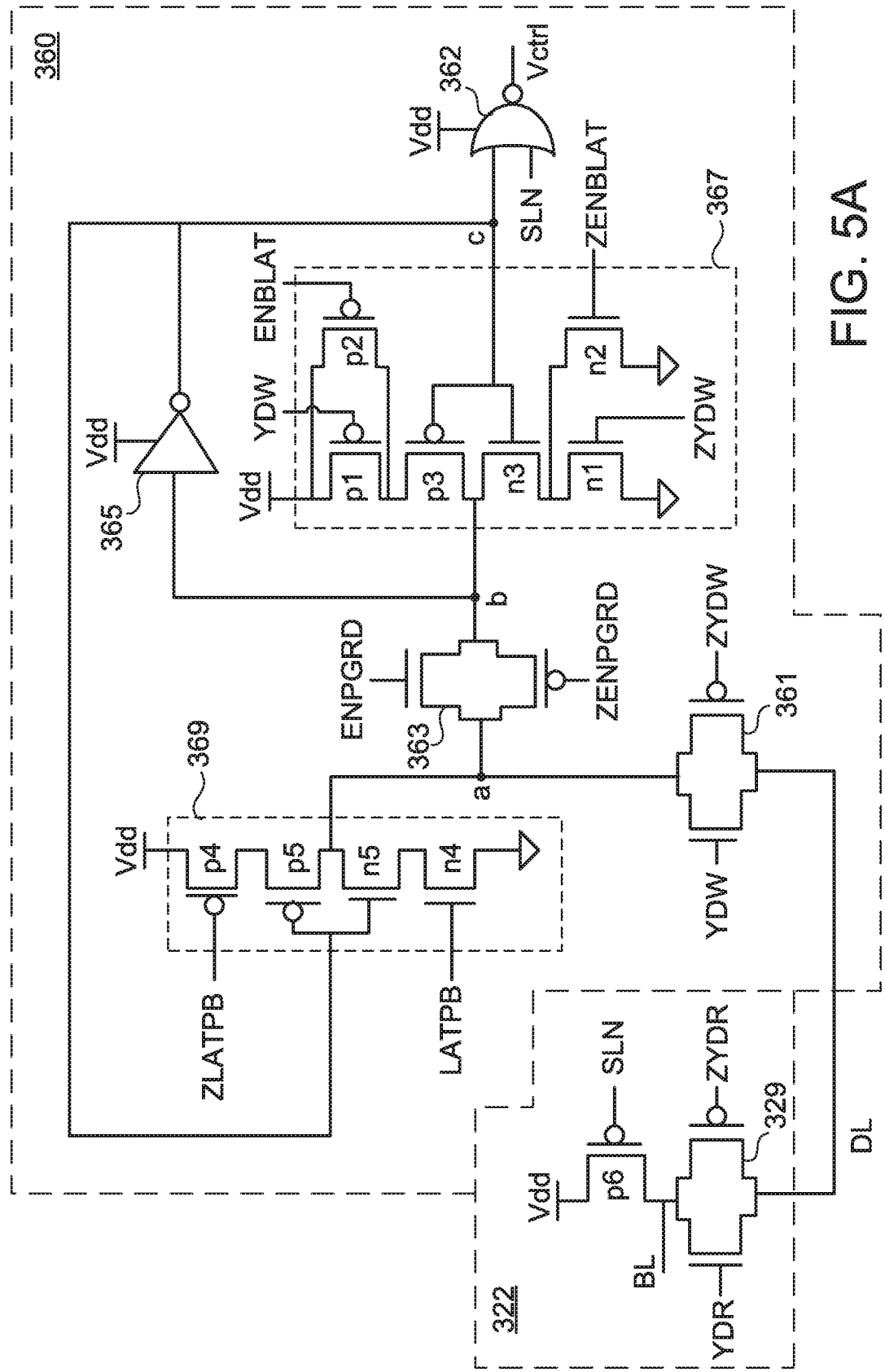
FIG. 5A is a schematic circuit diagram illustrating the decoding element and the program register of the non-volatile memory device according to the embodiment of the present invention.

FIG. 5A is a schematic circuit diagram illustrating the decoding element 322 and the program register 360 of the non-volatile memory device according to the embodiment of the present invention. The program register 360 comprises two switching circuits 361, 363, three inverters 365, 367, 369 and a logic circuit 362. The inverter 367 and the inverter 369 are tri-state inverters. The switching circuit 361 and the switching circuit 363 are transmission gates.

A first terminal of the switching circuit 361 is connected with the data line DL. A second terminal of the switching circuit 361 is connected with the node "a". The two control terminals of the switching circuit 361 are controlled according to two complementary control signals YDW and ZYDW. A first terminal of the switching circuit 363 is connected with the node "a". A second terminal of the switching circuit 363 is connected with the node "b". The two control terminals of the switching circuit 363 are controlled according to two complementary control signals ENPGRD and ZENPGRD. An input terminal of the inverter 365 is connected with the node "b". An output terminal of the inverter 365 is connected with the node "c". An input terminal of the inverter 367 is connected with the node "c". An output terminal of the inverter 367 is connected with the node "b". The inverter 367 is controlled according to the complementary control signals YDW and ZYDW and two complementary control signals ENBLAT and ZENBLAT. An input terminal of the inverter 369 is connected with the node "c". An output terminal of the inverter 369 is connected with the node "a". The inverter 369 is controlled according to two complementary control signals LATPB and ZLATPB. A first input terminal of the logic circuit 362 is connected with the node c. A second input terminal of the logic circuit 362 receives a pre-charge signal SLN. An output terminal of the logic circuit 362 generates the control voltage Vctrl. For example, the logic circuit 362 is a NOR gate.

The inverter 367 comprises three p-type transistors p1-p3 and three n-type transistors n1-n3. A first terminal of the p-type transistor p1 receives the first power supply voltage Vdd. A control terminal of the p-type transistor p1 receives the control signal YDW. A first terminal of the p-type transistor p2 receives the first power supply voltage Vdd. A control terminal of the p-type transistor p2 receives a control signal ENBLAT. A second terminal of the p-type transistor p2 is connected with a second terminal of the p-type transistor p1. A first terminal of the p-type transistor p3 is connected with the second terminal of the p-type transistor p1. A second terminal of the p-type transistor p3 is connected with the node "b". A control terminal of the p-type transistor p3 is connected with the node "c". A first terminal of the n-type transistor n1 is connected with the ground voltage. A control terminal of the n-type transistor n1 receives the control signal ZYDW. A first terminal of the n-type transistor n2 is connected with the ground voltage. A control terminal of the n-type transistor n2 receives a control signal ZENBLAT. A second terminal of the n-type transistor n2 is connected with a second terminal of the n-type transistor n1. A first terminal of the n-type transistor n3 is connected with the second terminal of the n-type transistor n1. A second terminal of the n-type transistor n3 is connected with the node "b". A control terminal of the n-type transistor n3 is connected with the node "c".

The inverter 369 comprises p-type transistors p4, p5 and n-type transistors n4, n5. A first terminal of the n-type transistor n4 is connected with the ground voltage. A control terminal of the n-type transistor n4 receives the control signal LATPB. A first terminal of the n-type transistor n5 is connected with a second terminal of the n-type transistor n4. A second terminal of the n-type transistor n5 is connected with the node "a". A control terminal of the n-type transistor n5 is connected with the node "c". A first terminal of the p-type transistor p4 receives the first power supply voltage Vdd. A control terminal of the p-type transistor p4 receives the control signal ZLATPB. A first terminal of the p-type transistor p5 is connected with a second terminal of the p-type transistor p4. A second terminal of the p-type transistor p5 is connected with the node "a". A control terminal of the p-type transistor p5 is connected with the node "c".

The decoding element 322 comprises a switching circuit 329 and a pre-charge circuit. The pre-charge circuit comprises a transistor p6.

A first terminal of the pre-charge circuit receives the first power supply voltage Vdd. A second terminal of the pre-charge circuit is connected with the bit line BL. A control terminal of the pre-charge circuit receives the pre-charge signal SLN. A first terminal of the switching circuit 329 is connected with the bit line BL. A second terminal of the switching circuit 329 is connected with the data line DL. The two control terminals of the switching circuit 329 are controlled according to two complementary control signals YDR and ZYDR.

Figure 5B:
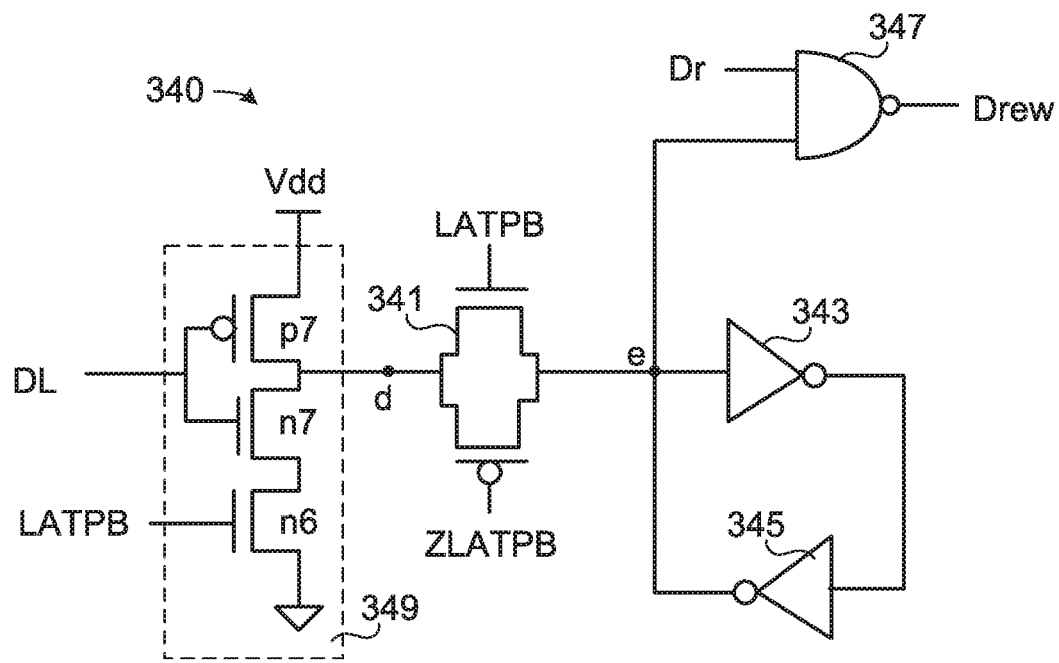
FIG. 5B is a schematic circuit diagram illustrating the verification circuit of the non-volatile memory device according to the embodiment of the present invention.

FIG. 5B is a schematic circuit diagram illustrating the verification circuit 340 of the non-volatile memory device according to the embodiment of the present invention. The verification circuit 340 comprises a switching circuit 341, three inverters 349, 343, 345 and a logic circuit 347. The inverter 349 is a tri-state inverter. The logic circuit 347 is a NAND gate.

An input terminal of the inverter 349 is connected with the data line DL. An output terminal of the inverter 349 is connetced with the node "d". The inverter 349 is controlled according to a control signal LATPB. A first terminal of the switching circuit 341 is connetced with the node "d". A second terminal of the switching circuit 341 is connetced with the node "e". The two terminals of the switching circuit 341 are controlled according to two complementary control signals LATPB and ZLATPB. An input terminal of the inverter 343 is connected with the node "e". An output terminal of the inverter 343 is connected with an input terminal of the inverter 345. An output terminal of the inverter 345 is connected with the node "e". A first input terminal of the logic circuit 347 is connected with the node "e". A second input terminal of the logic circuit 347 receives the read data Dr. An output terminal of the logic circuit 347 generates the rewrite data Drew.

The inverter 349 comprises a p-type transistor p7 and n-types n6, n7. A first terminal of the n-type transistor n6 is connected with the ground voltage. A control terminal of the n-type transistor n6 receives the control signal LATPB. A first terminal of the n-type transistor n7 is connected with a second terminal of the n-type transistor n6. A second terminal of the n-type transistor n7 is connected with the node "d". A control terminal of the n-type transistor n7 is connected with the data line DL. A first terminal of the p-type transistor p7 receives the first power supply voltage Vdd. A second terminal of the p-type transistor p7 is connected with the node "d". A control terminal of the p-type transistor p7 is connected with the data line DL.

Figure 5C:
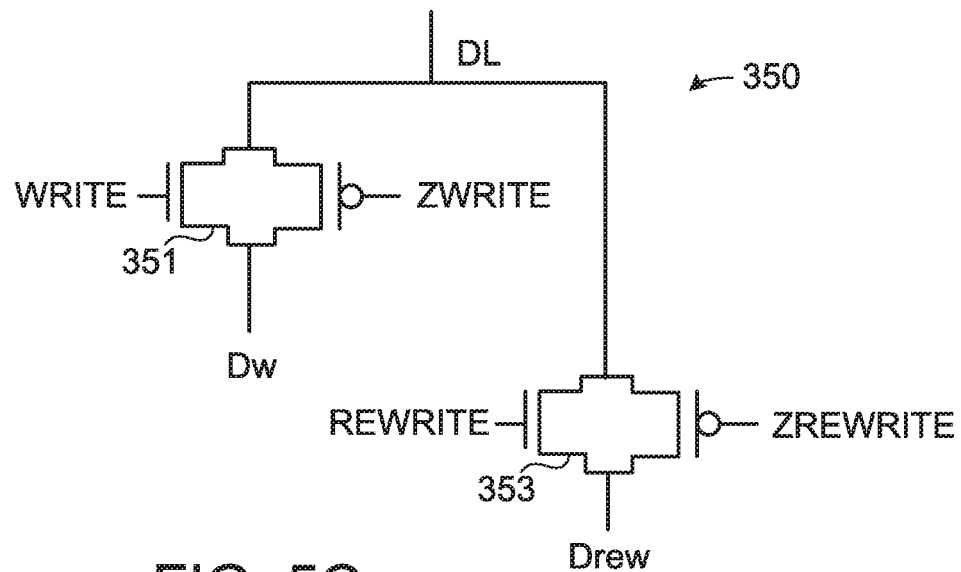
FIG. 5C is a schematic circuit diagram illustrating the path control circuit of the non-volatile memory device according to the embodiment of the present invention.

FIG. 5C is a schematic circuit diagram illustrating the path control circuit of the non-volatile memory device according to the embodiment of the present invention. The path control circuit 350 comprises switching circuits 351 and 353.

A first terminal of the switching circuit 351 is connected with the data line DL. A second terminal of the switching circuit 351 receives the the rewrite data Drew. The two control terminals of the switching circuit 351 are controlled according to two complementary control signals WRITE and ZWRITE. A first terminal of the switching circuit 353 is connected with the data line DL. A second terminal of the switching circuit 353 receives the the rewrite data Drew. The two control terminals of the switching circuit 353 are controlled according to two complementary control signals REWRITE and REWRITE.

Hereinafter, the processes of performing the write operation, the read operation, the verification operation and the rewrite operation will be described with reference to the circuits of FIGS. 5A, 5B and 5C.

While the write operation is performed, the switching circuit 351 of the path control circuit 350 is in a close state and the switching circuit 353 of the path control circuit 350 is in an open state. Consequently, the write data Dw is transmitted to the data line DL. In the program register 360, the switching circuits 361 and 363 are in the close state, the inverters 365 and 367 are enabled, and the inverter 369 is disabled. Consequently, the program register 360 receives the write data Dw from the data line DL. A first latch is defined by the inverters 365 and 367 collaboratively. Consequently, the write data Dw is stored into the node "b", and the inverted write data Dw is stored into the node "c". The pre-charge signal SLN is in a logic high level state ("0"). Consequently, the control voltage Vctrl outputted from the logic circuit 362 is determined according to the logic level of the write data Dw.

For example, if the write data Dw is in the logic high level state "1", the logic circuit 362 generates the control voltage Vctrl with the first power supply voltage Vdd. Consequently, the selected memory cell 312 is programmed to the first storage state. Whereas, if the write data Dw is in the logic low level state "0", the logic circuit 362 generates the ground voltage ("0"). Consequently, the selected memory cell 312 is programmed to the second storage state.

While the write operation is performed, the sense amplifier 330, the decoding element 322 and the verification circuit 340 are disabled.

While the read operation is performed, the sense amplifier 330 is enabled. Moreover, the switching circuit 329 of the decoding element 322 is in the close state. Consequently, the bit line BL is connected with the data line DL. Meanwhile, the read current Ir generated by the selected memory cell 312 is transmitted from the bit line BL to the sense amplifier 330 through the data line DL. Moreover, the sense amplifier 330 determines the storage state of the selected memory cell 312 according to the magnitude of the read current Ir. If the magnitude of the read current Ir generated by the selected memory cell 312 is lower than the reference current Iref, the sense amplifier judges that the selected memory cell 312 is in the first storage state. Meanwhile, the read data Dr generated by the sense amplifier 330 is in the logic low level state "0". Whereas, if the magnitude of the read current Ir generated by the selected memory cell 312 is higher than the reference current Iref, the sense amplifier judges that the selected memory cell 312 is in the second storage state. Meanwhile, the read data Dr generated by the sense amplifier 330 is in the logic high level state "1".

Moreover, while the read operation is performed, the path control circuit 350, the program register 360 and the verification circuit 340 are disabled.

While the verification operation is performed, the switching circuits 361 and 363 of the program register 360 are in the close state, the inverters 365, 367 and 369 are enabled, a first latch is defined by the inverters 365 and 367 collaboratively, and the second latch is defined by the inverters 365 and 369. The return data Db is transmitted from the program register 360 to the data line DL. Consequently, the return data Db is the write data Dw that is temporarily stored in the program register 360 while the write operation is performed.

Moreover, in the verification circuit 340, the inverters 349, 343 and 345 are enabled, and the switching circuit 341 is in the close state. Consequently, the return data Db is transmitted from the data line DL to the verification circuit 340. A third latch is defined by the inverters 345 and 343 collaboratively. Consequently, the inverted return data Db is stored in the node "e". According to the read data Dr and the inverted return data Db, the logic circuit 347 generates the rewrite data Drew.

For example, if the read data Dr and the inverted return data Db are complementary to each other or the read data Dr and the inverted return data Db are in the logic low level state "0", the logic circuit 347 generates the rewrite data Drew in the logic high level state "1". Whereas, if the read data Dr and the inverted return data Db are in the logic high level state "1", the logic circuit 347 generates the rewrite data Drew in the logic low level state "0".

While the rewrite operation is performed, the switching circuit 353 of the path control circuit 350 is in the close state, and the switching circuit 351 is in the open state. Consequently, the rewrite data Drew is transmitted to the data line DL. In the program register 360, the switching circuits 361 and 363 are in the close state, the inverters 365 and 367 are enabled, and the inverter 369 is disabled. Consequently, the rewrite data Drew is transmitted from the data line DL to the program register 360. Since a first latch is defined by the inverters 365 and 367, the rewrite data Drew is stored into the node "b", and the inverted rewrite data Drew is stored into the node "c". Moreover, the pre-charge signal SLN is in the in the logic low level state "0". Consequently, the control voltage Vctrl from the logic circuit 362 is determined according to the logic level of the rewrite data Drew. According to the control voltage Vctrl, the selected memory cell 312 is programmed to the first storage state or the second storage state again.

The circuitry structures of the inverters 367, 369 and 349 are not restricted. That is, the inverters with similar functions may be used. Similarly, the circuitry structures of the switching circuits 329, 361, 363, 341, 351 and 353 and the logic circuits 362 and 347 are not restricted. For example, a single n-type transistor or a single p-type transistor may be used as the switching circuit, and a single control signal is used to control the switching circuit to be in the close state or the open state. Similarly, the logic circuits may be implemented through other logic gates.

From the above descriptions, the present invention provides a non-volatile memory device and a peripheral circuit with the data verifying and rewriting functions. During the program cycle of the non-volatile memory device, a write operation, a read operation, a verification operation and a rewrite operation are performed on the selected memory cell. The above operations are repeatedly done by the peripheral circuit until the verification operation passes and the program cycle is completed. After the program cycle is completed, the write data is accurately written into the selected memory cell.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A non-volatile memory device, comprising:
   a memory cell array comprising a first memory cell, wherein the first memory cell is connected with a bit line;
   a Y decoder comprising a first decoding element, wherein the first decoding element is connected between the bit line and a data line;
   a program register connected with the data line, and generating a control voltage to the first memory cell;
   a sense amplifier connected with the data line, and generating a read data;
   a verification circuit connected between the sense amplifier and the data line, and generating a rewrite data; and
   a path control circuit connected with the data line, and receiving a write data and the rewrite data.

2. The non-volatile memory device as claimed in claim 1, wherein while a write operation is performed, the write data is transmitted to the data line through the path control circuit, wherein after the write data from the data line is received by the program register, the write data is temporarily stored in the program register and the write data is converted into a control voltage by the program register, wherein the first memory cell is programmed to a first storage state or a second storage state according to the control voltage.

3. The non-volatile memory device as claimed in claim 2, wherein while a read operation is performed, the bit line is connected with the data line through the first decoding element, and the first memory cell generates a read current to the sense amplifier through the bit line and the data line, wherein according to a magnitude of the read current, the sense amplifier generates the read data to indicate whether the first memory cell is in the first storage state or the second storage state.

4. The non-volatile memory device as claimed in claim 3, wherein while a verification operation is performed, the program register issues a return data to the data line, wherein after the verification circuit receives the read data and receives the return data from the data line, the verification circuit generates the rewrite data according to the return data and the read data.

5. The non-volatile memory device as claimed in claim 4, wherein return data is identical to the write data.

6. The non-volatile memory device as claimed in claim 4, wherein while a rewrite operation is performed, the rewrite data is transmitted to the data line through the path control circuit, wherein after the rewrite data from the data line is received by the program register, the rewrite data is temporarily stored in the program register and the rewrite data is converted into the control voltage by the program register, wherein the first memory cell is programmed to the first storage state or the second storage state according to the control voltage.

7. The non-volatile memory device as claimed in claim 1, wherein the first decoding element comprises:
   a pre-charge circuit, wherein a first terminal of the pre-charge circuit receives the first power supply voltage, a second terminal of the pre-charge circuit is connected with the bit line, and a control terminal of the pre-charge circuit receives a pre-charge signal; and
   a first switching circuit, wherein a first terminal of the first switching circuit is connected with the bit line, a second terminal of the first switching circuit is connected with the data line, and at least one control terminal of the first switching circuit receives a first control signal.

8. The non-volatile memory device as claimed in claim 7, wherein the program register comprises:
   a second switching circuit, wherein a first terminal of the second switching circuit is connected with the data line, a second terminal of the second switching circuit is connected with a first node, and at least one control terminal of the second switching circuit receives a second control signal;
   a third switching circuit, wherein a first terminal of the third switching circuit is connected with the first node, a second terminal of the third switching circuit is connected with a second node, and at least one control terminal of the third switching circuit receives a third control signal;
   a first inverter, wherein an input terminal of the first inverter is connected with the second node, and an output terminal of the first inverter is connected with a third node;
   a second inverter, wherein an input terminal of the second inverter is connected with the third node, and an output terminal of the second inverter is connected with the second node;
   a third inverter, wherein an input terminal of the third inverter is connected with the third node, and an output terminal of the third inverter is connected with the first node; and
   a first logic circuit, wherein a first input terminal of the first logic circuit is connected with the third node, a second input terminal of the first logic circuit receives the pre-charge signal, and an output terminal of the first logic circuit generates the control voltage.

9. The non-volatile memory device as claimed in claim 8, wherein the first logic circuit is a NOR gate, wherein a first input terminal of the NOR gate is connected with the third node, a second input terminal of the NOR gate receives the pre-charge voltage, and an output terminal of the NOR gate generates the control voltage.

10. The non-volatile memory device as claimed in claim 8, wherein the second inverter comprises:
    a first p-type transistor, wherein a first terminal of the first p-type transistor receives the first power supply voltage, and a control terminal of the first p-type transistor receives the second control signal;
    a second p-type transistor, wherein a first terminal of the second p-type transistor receives the first power supply voltage, a control terminal of the second p-type transistor receives a fourth control signal, and a second terminal of the second p-type transistor is connected with a second terminal of the first p-type transistor;
    a third p-type transistor, wherein a first terminal of the third p-type transistor is connected with the second terminal of the first p-type transistor, a second terminal of the third p-type transistor is connected with the second node, and a control terminal of the third p-type transistor is connected with the third node;
a first n-type transistor, wherein a first terminal of the first n-type transistor is connected with a ground voltage, and a control terminal of the first n-type transistor receives an inverted second control signal;
a second n-type transistor, wherein a first terminal of the second n-type transistor is connected with the ground voltage, a control terminal of the second n-type transistor receives an inverted fourth control signal, and a second terminal of the second n-type transistor is connected with a second terminal of the first n-type transistor; and
a third n-type transistor, wherein a first terminal of the third n-type transistor is connected with the second terminal of the first n-type transistor, a second terminal of the third n-type transistor is connected with the second node, and a control terminal of the third n-type transistor is connected with the third node.

11. The non-volatile memory device as claimed in claim 8, wherein the third inverter comprises:
a fourth n-type transistor, wherein a first terminal of the fourth n-type transistor is connected with a ground voltage, and a control terminal of the fourth n-type transistor receives a fifth control signal;
a fifth n-type transistor, wherein a first terminal of the fifth n-type transistor is connected with a second terminal of the fourth n-type transistor, a second terminal of the fifth n-type transistor is connected with the first node, and a control terminal of the fifth n-type transistor is connected with the third node;
a fourth p-type transistor, wherein a first terminal of the fourth p-type transistor receives the first power supply voltage, and a control terminal of the fifth p-type transistor receives an inverted fifth control signal; and
a fifth p-type transistor, wherein a first terminal of the fifth p-type transistor is connected with a second terminal of the fourth p-type transistor, a second terminal of the fifth p-type transistor is connected with the first node, and a control terminal of the fifth p-type transistor is connected with the third node.

12. The non-volatile memory device as claimed in claim 11, wherein the verification circuit comprises:
a fourth inverter, wherein an input terminal of the fourth inverter is connected with the data line, and an output terminal of the fourth inverter is connected with a fourth node;
a fourth switching circuit, wherein a first terminal of the fourth switching circuit is connected with the fourth node, a second terminal of the fourth switching circuit is connected with a fifth node, and at least one control terminal of the fourth switching circuit receives a fifth control signal;
a fifth inverter, wherein an input terminal of the fifth inverter is connected with the fifth node;
a sixth inverter, wherein an input terminal of the sixth inverter is connected with an output terminal of the fifth inverter, and an output terminal of the sixth inverter is connected with the fifth node; and
a second logic circuit, wherein a first input terminal of the second logic circuit is connected with the fifth node, a second input terminal of the second logic circuit receives the read data, and an output terminal of the second logic circuit generates the rewrite data.

13. The non-volatile memory device as claimed in claim 12, wherein the second logic circuit is a NAND gate, wherein a first input terminal of the second logic circuit is connected with the fifth node, a second input terminal of the NAND gate receives the read data, and an output terminal of the NAND gate generates the rewrite data.

14. The non-volatile memory device as claimed in claim 12, wherein the fourth inverter comprises:
a sixth n-type transistor, wherein a first terminal of the sixth n-type transistor is connected with the ground voltage, and a control terminal of the sixth n-type transistor receives the fifth control signal;
a seventh n-type transistor, wherein a first terminal of the seventh n-type transistor is connected with a second terminal of the sixth n-type transistor, a second terminal of the seventh n-type transistor is connected with the fourth node, and a control terminal of the seventh n-type transistor is connected with the data line; and
a sixth p-type transistor, wherein a first terminal of the sixth p-type transistor receives the first power supply voltage, a second terminal of the sixth p-type transistor is connected with the fourth node, and a control terminal of the sixth p-type transistor is connected with the data line.

15. The non-volatile memory device as claimed in claim 1, wherein the path control circuit comprises:
a fifth switching circuit, wherein a first terminal of the fifth switching circuit is connected with the data line, a second terminal of the fifth switching circuit receives the write data, and at least one control terminal of the fifth switching circuit receives a sixth control signal; and
a sixth switching circuit, wherein a first terminal of the sixth switching circuit is connected with the data line, a second terminal of the sixth switching circuit receives the rewrite data, and at least one control terminal of the sixth switching circuit receives a seventh control signal.

* * * * *